United States Patent [19]

Kannegundla

[11] Patent Number: 5,294,848
[45] Date of Patent: Mar. 15, 1994

[54] WIDE VARIATION TIMED DELAYED DIGITAL SIGNAL PRODUCING CIRCUIT

[75] Inventor: Ram Kannegundla, Rochester, N.Y.

[73] Assignee: Eastman Kodak Company, Rochester, N.Y.

[21] Appl. No.: 966,646

[22] Filed: Oct. 26, 1992

[51] Int. Cl.⁵ .................... H03K 5/13; H03K 17/28
[52] U.S. Cl. ........................ 307/602; 307/265; 307/597; 307/601; 328/55; 328/58
[58] Field of Search ............ 307/262, 263, 265, 266, 307/267, 597, 601, 602; 328/55, 58

[56] References Cited

U.S. PATENT DOCUMENTS

| | | | |
|---|---|---|---|
| 3,786,357 | 1/1974 | Belle Isle | 307/602 |
| 3,952,213 | 4/1976 | Fukuya | 307/265 |
| 4,169,287 | 9/1979 | Middendorf et al. | 307/271 |
| 4,583,007 | 4/1986 | Grugett | 307/265 |
| 4,717,835 | 1/1988 | Takeuchi | 307/265 |
| 4,857,760 | 8/1989 | Stuebing | 307/234 |
| 5,032,740 | 7/1991 | Kannegundla | 307/264 |

FOREIGN PATENT DOCUMENTS 0178623 8/1983 Japan .................... 307/602

Primary Examiner—William L. Sikes
Assistant Examiner—Terry D. Cunningham
Attorney, Agent, or Firm—Raymond L. Owens

[57] ABSTRACT

A time delayed digital circuit includes three circuits, each of which includes two inverters used in charging and discharging a capacitor to produce a precisely delayed output digital signal which can have wide variations.

1 Claim, 4 Drawing Sheets

WIDE VARIATION TIMED DELAYED DIGITAL SIGNAL PRODUCING CIRCUIT

CROSS REFERENCE TO RELATED APPLICATION

Reference is made to commonly assigned U.S. patent application Ser. No. 922,410 filed Jul. 31, 1992 to Ram Kannegundla entitled "Timed Delayed Digital Signal Producing Circuit."

Field of the Invention

The present invention relates to circuits for producing precisely timed delayed wide variation digital signals such as square wave signals which can be used for operating charge coupled devices (CCDs).

Background of the Invention

When used for electronic imaging, charged coupled devices referred to as CCDs often require precisely positioned pulses with respect to the horizontal clock signal by using a delayed leading edge. These pulses are produced in response to an input square wave clock signal. For example, a buffer amplifier on a CCD sensor is used to sense the voltages of a floating diffusion. The floating diffusion needs to be reset before the charge is transferred by the next clock cycle. The required pulse, known as a reset pulse, is generated by a precisely delayed leading edge of the square wave signal. Additionally, the output amplifier of the CCD is sampled, held and compared to a charge level on the floating diffusion. The sample and hold also needs precisely positioned pulses. The output amplifier can be controlled also by a timed delayed square wave. In CCD sensors, it is essential that a circuit be provided that has facility of precisely delaying a square wave signal which is used to generate the precisely positioned pulses into required pulsewidth, as well as producing pulses which are precisely positioned and which have a predetermined pulse width.

The classical way of generating such pulses (which are of high frequency in the order of 10-20 MHz) is done by means of fixed timed delayed chips and combinatorial logic. This approach is expensive, and very difficult to change the precisely positioned pulses. The required timed delay can also be achieved by resistor capacitor circuits but it is difficult to lengthen delay time and also produce required pulse widths with such circuits. In accordance with this invention a wide variation circuit can work with input signals of 40 MHz.

SUMMARY OF THE INVENTION

It is an object of this invention to provide a circuit which eliminates the above problems and which produces widely variable delayed digital signals such as square waves.

This object is achieved in a wide variation timed delay signal producing circuit responsive to an input signal for providing a series of precisely timed delay pulses each having a predetermined pulse width, comprising:

(a) first, second and third circuits each responsive to an input signal and producing an output square wave signal, the first circuit receiving the input square wave signal and providing an output square wave signal to the second and third circuits which are coupled in parallel, each such circuit including:

(i) first and second inverters connected in series and responsive to the input digital signal for respectively providing complementary output square wave signals shifted in phase by 180°;

(ii) a first resistor and a capacitor serially coupled between the output of the second inverter and the first inverter; and (iii) threshold means responsive to the voltage at the electrical junction of the first resistor and the capacitor which when one such capacitor charges to produce a voltage above a first level provides one edge of an output square wave signal and when the capacitor discharges below a second level provides the other edge of the output square wave signal, the time constants of each circuit being selected to be different;

(b) means for inverting the output square wave signal from the third circuit threshold means; and (c) AND gate means responsive to the inverted square wave signal from the third circuit and the output square wave signal from the second circuit for producing a series of precisely timed delayed pulses, with each pulse having a predetermined pulse width.

Recent advances in digital circuits have permitted them to operate at increasing speeds. Computers including such circuits also run at higher speed at lower power. The present invention permits high speed digital signals to be precisely timed delayed. Moreover, with a circuit in accordance with this invention, a wide variation of pulse width as well as precise positioning of such pulse is made possible for input square wave signals having a 40 MH$_2$ frequency.

DETAILED DESCRIPTION

Figure 1:
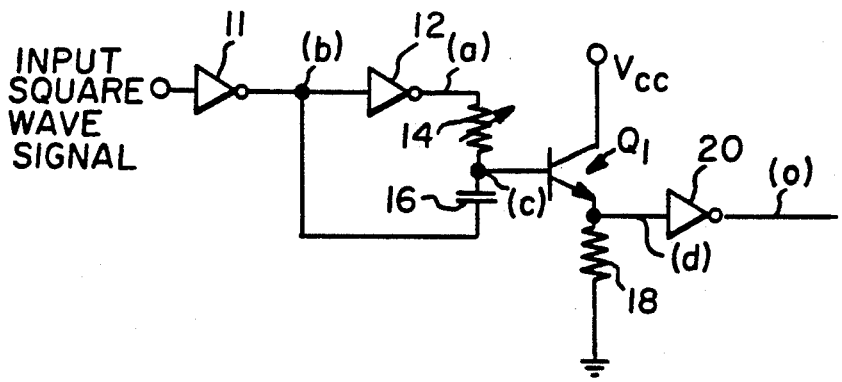
FIG. 1 shows a circuit which produces a precisely delayed digital signal.
Figure 1A:
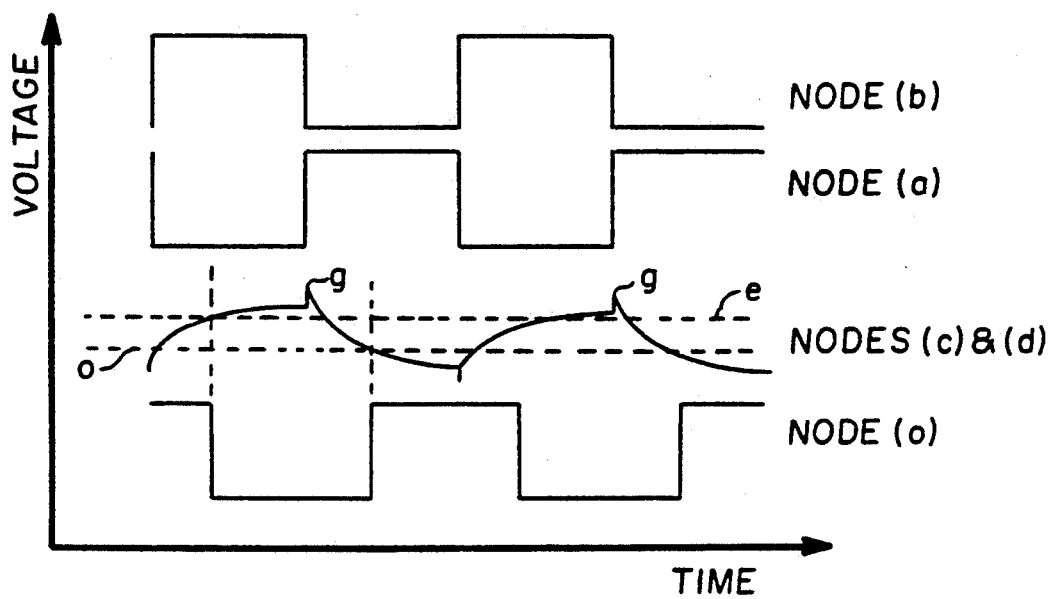
FIG. 1a shows voltage waveforms at various nodes or points in the circuit of FIG. 1.

Turning now to FIGS. 1 and 1a, there is shown a digital signal delay circuit 10 in accordance with the invention. The circuit 10 includes two serially connected inverters 11 and 12. In this disclosure the input digital signal is a square wave clock signal although other types of digital signals will suggest themselves to those skilled in the art. In response to the input digital signal, inverters 11 and 12 provide complimentary square wave signals at nodes (a) and (b) (assuming no or insignificant delay) (see FIG. 1a) which have complimentary waveforms that are 180° out of phase. Serially connected at the output of inverter 12 is a resistor 14 and a capacitor 16, the resistance of resistor 14 can selectively be adjusted. An emitter follower amplifier circuit, includes a transistor Q$_1$ and a resistor 18, with the base electrode of transistor Q$_1$ being connected at the electrical junction of capacitor 16 and resistor 14.

The waveform at node (d) and at node (c) are the same except that, at node (d), the voltage waveform is lowered by base emitter junction drop (0.7 v). Coupled at the electrical junction of the emitter of the transistor $Q_1$ and the resistor 18 is an inverter circuit 20. This type of inverter is well understood in the art and changes from a high signal level to a low signal level when the voltage at node (d) rises above a selected voltage threshold level (e) and when the voltage at node (d) falls below a selected voltage threshold level (f), the output changes to a high level. See the dotted lines (e) and (f) which intersect the voltage waveform in node (d) in FIG. 1a. The differences between threshold levels (d) and (f) provides a wide variety of controlling time delays of leading and trailing edges. Example of an inverter that can be used is logic gate 74FO4 hex inverter manufactured by Fairchild.

In operation when the voltage at node (a) turns high, then the voltage at node (b) is low and the capacitor 16 begins to charge. It should be noted that, at the point in time when node (a) changes from low to high, a spike (g) (FIG. 1a) occurs in the waveforms at node (c) and node (d). This sudden change in voltage level at node (d) is raised almost instantaneously because of the superposition of the voltage on the capacitor (c) with the high voltage from the inverter 11. This enables the capacitor 16 to pump very high initial current through the resistor 14 and provides a longer time for the voltage to exponentially decay. Both the leading and lagging edges of the output square wave at the output of the inverter 20 or node (o) can be adjusted over a longer time interval than has been heretofore been practical.

Figure 2:
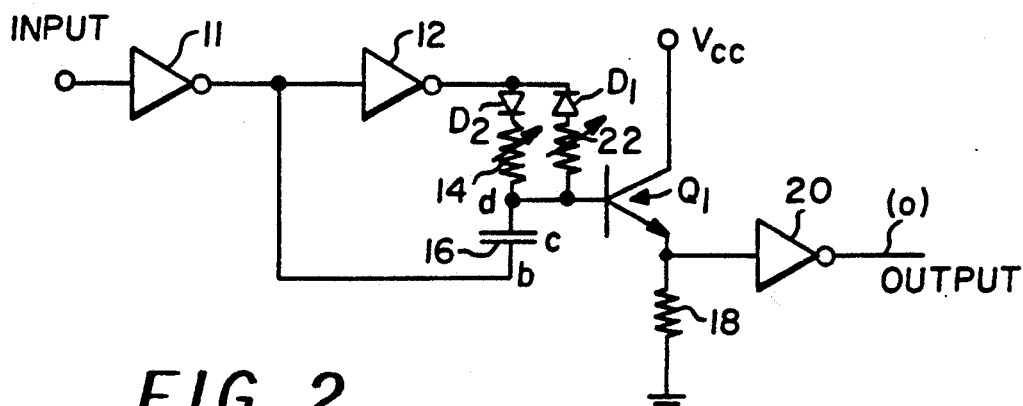
FIG. 2 shows a circuit similar to FIG. 1 but which produces a series of precisely timed delayed pulses in which the leading and trailing edges are independently controlled, each having a predetermined width.

Turning now to FIG. 2, we see a similar circuit to FIG. 1. Where elements correspond to FIG. 1, the same numerals will be used. A first diode $D_1$ is connected in series with resistor 22 to the output of inverter 12 and a second diode $D_2$ and resistor 14 is connected in parelle across diode $D_1$ and resistor 22. By means of this arrangement, the leading and trailing edges of the output signal can be adjusted independently. Therefore, inverter 20 can produce a series of pulses. The timing of the falling edge of the pulse is determined by the charging time constant of resistor 14 and capacitor 16 and can be changed by changing the resistance of resistor 14. The timing of the rising edge of each pulse is determined in a similar manner by the discharging time constant resistor 22 and capacitor 16. The circuit shown in FIG. 2 not only precisely delays the leading and trailing edge of each pulse, but also actively provides a desired pulse width.

Figure 3:
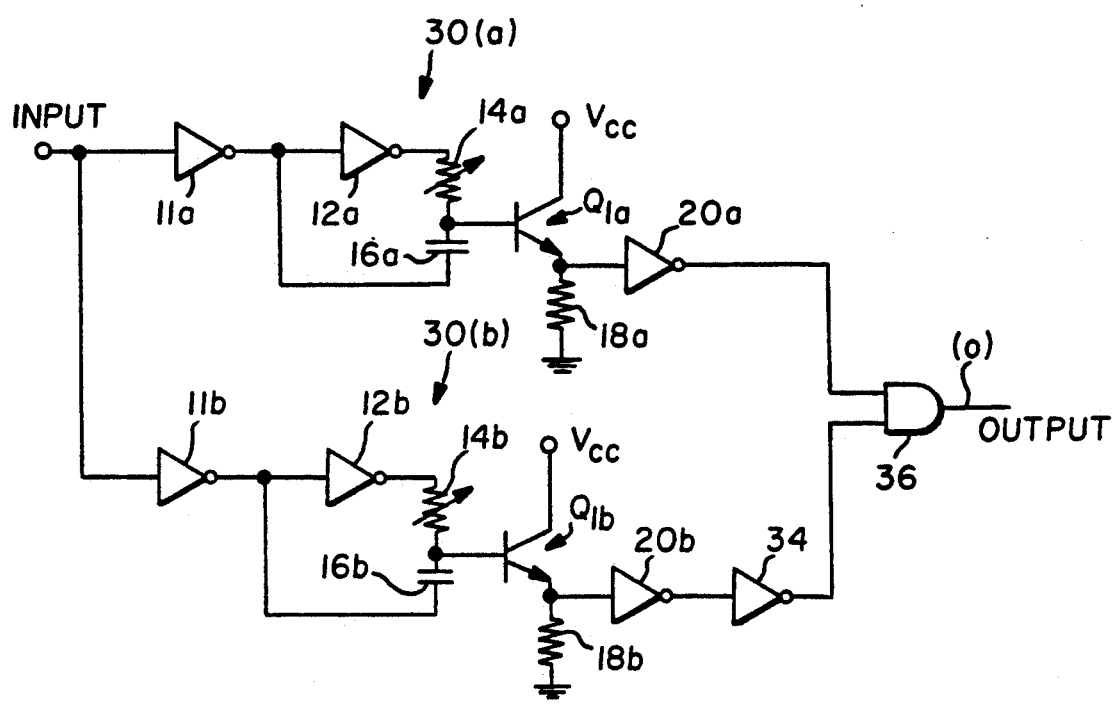
FIG. 3 shows another circuit which produces a series of precisely delayed Pulses, with precise pulsewidths.
Figure 3A:
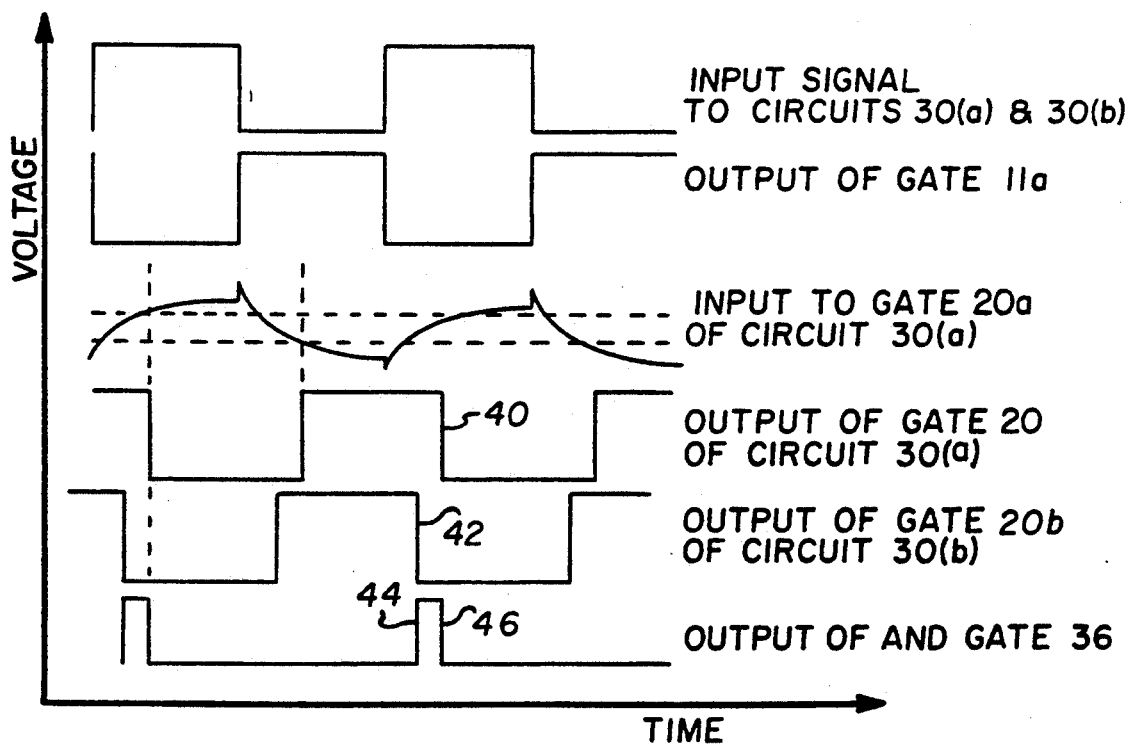
FIG. 3a shows voltage waveforms at various nodes or points in the circuit of FIG. 3.

Turning now to FIGS. 3 and 3a, we see two circuits 30a and 30b. Circuits 30a and 30b are similar in construction with the circuits shown in FIG. 1 with two exceptions. First, the time constants of each circuit are different and second, in circuit 30b at the output of threshold inverter 20b, another inverter 34 is provided. The input to both circuits 30a and 30b is as shown in FIG. 3a, a square wave clock signal. The output of the two emitter follower amplifiers are shown. The output of the circuits 30a and 30b are shown shifted in time and applied to an AND gate 36. The output of the AND gate 36 is a series of pulses precisely delayed in time and having a desired pulse width which is selected by adjusting the resistance of resistors 14a and 14b of the two circuits 30a and 30b. In this circuit, the position the resulting pulse at node "0" in FIG. 3 is shown in FIG. 3a. The leading edge 44 of the output AND gate 36 is obviously a function of edge 42 in the output of gate 20b which is in turn controlled by resistor 14b in circuit 30b of FIG. 3. Similarly, the falling edge 46 of the pulse provided by AND gate 36 is a function of edge 40, which in turn is controlled by resistor 14a of circuit 30(a). The width of the resulting pulse is a function of resistor 14b and 14a and the starting position of the pulse is the function of resistor 14b. With this arrangement, the scope of variation of delay is limited only to the half cycle of the given input clock signal thus limiting its use for input clock signals of less than 10 mHz. The circuit of FIG. 4 eliminates this limitation and enabled to be useful up to 40 MHz.

Figure 4:
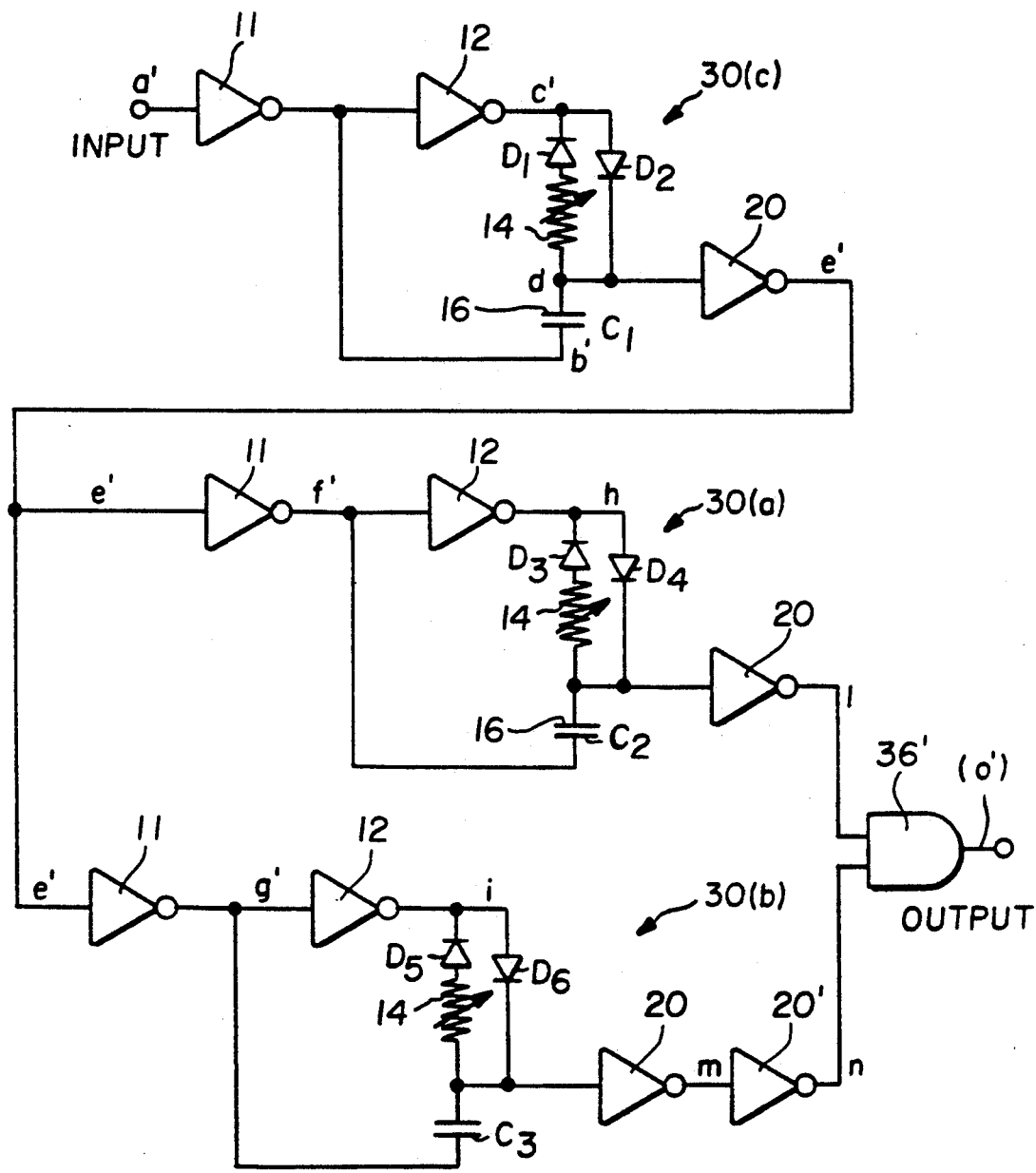
FIG. 4 shows a circuit in accordance with this invention.

To achieve a wider range of adjustment the inverter circuit of FIG. 4 is provided. Moreover this circuit will increase the frequency range as will be explained. As shown in FIG. 4, there are three digital signal delay circuits 30(a), 30(b) and 30(c), each of which is similar to that in FIG. 2. Where parts correspond the same numerals will be used. It should be noted that the given 50% duty cycle signal is changed to approximately 10% duty cycle at e'. Circuit 30(c) receives the input signal and its output is produced by its inverted circuit 20 to the inverter circuits 11 of circuits 30(a) and 30(b) which are coupled in parallel. Inverter 20 of circuit 30(b) is connected to an inverter circuit 20'. The output of inverter circuit 20' is connected to an AND gate 36' which functions similar to the AND gate 30 of FIG. 3. Finally, the output of inverter 20 of circuit 30(a) is also applied as an input to AND gate 36'.

Figure 4A:
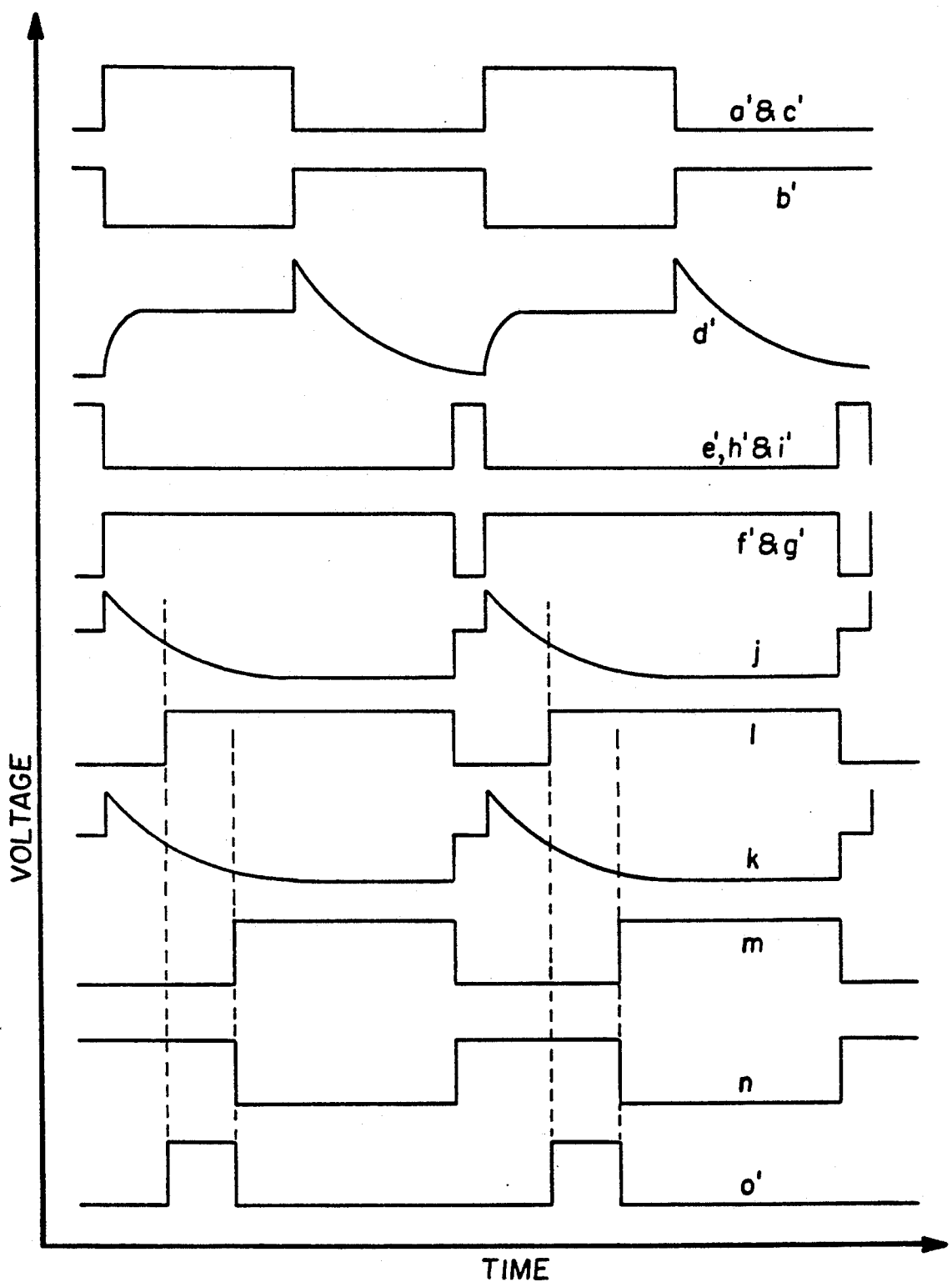
FIG. 4a shows the waveforms for the circuit of FIG. 4.

FIG. 4(a) shows the waveform of voltage signals at various designated points in the circuit of FIG. 4. As shown in FIG. 4(a) for the circuit 30(c), the square wave voltage waveforms at positions a' and c' are identical neglecting the gate delays of inverters 11 and 12. At point b' there is digital inversion of the voltage at a'. During the time when the voltage c' is high and that at b' low, the capacitor 16($C_1$) charges instantly through diode D2. During the time c' is low and b' is high, the voltage at capacitor 16($C_1$) is more than the supply voltage as shown in FIG. 4(a) and the voltage at this capacitor discharges through capacitor 16 and resistor 14 which have a predetermined time constant. By properly adjusting resistor 14 (and the time constant), the waveform at the output of inverter 20, which as shown at position e', is a short duration pulse.

By providing this short duration pulse to circuits 30(a) and 30(b), whose operations are similar to circuit 30(c), the output at 0 will be able to produce a wide skewing facility (duty cycle) due to the increased duration time shown at nodes j and k in FIG. 4(a). The discharging time constants for circuits 30(a) and 30(b) are separately adjustable and thus the voltage waveforms at positions l and m are different width duration square wave pulses. The waveform n is the inversion of the waveform at m. By "ANDING" the squarewave voltage signals at positions l and n, the AND gate 36' produces a desired output signal. Such output signal at o' is a series of precisely delayed pulses with each pulse having a predetermined width. By varying the resistor 14 in circuit 30(a), the time constant of circuit 30(a) is changed and the starting position of the pulse at o' is adjusted. Similarly, the position of the falling edge of the output signal(o') is adjusted by changing the time constant of circuit 30(c). The resulting pulse appears anywhere during the low level of the output e' which is 90% of the duty cycle for a 10 MHz signal.

The invention has been described in detail with particular reference to certain preferred embodiments thereof, but it will be understood that variations and modifications can be effected within the spirit and scope of the invention.

What is claimed is:

1. A wide variation time delayed signal producing circuit responsive to an input signal for providing a series of precisely timed delay pulses each having a predetermined pulse width, comprising:
   (a) first, second and third circuits each responsive to an input signal and producing an output square wave signal, the first circuit receiving the input square wave signal and providing an output square wave signal to the second and third circuits which are coupled in parallel, each such circuit including:
      (i) first and second inverters connected in series and responsive to the input digital signal for respectively providing complementary output square wave signals shifted in phase by 180°;
      (ii) a first resistor and a capacitor serially coupled between the output of the second inverter and the first inverter; and
      (iii) threshold means responsive to the voltage at the electrical junction of the first resistor and the capacitor which when one such capacitor charges to produce a voltage above a first level provides one edge of an output square wave signal and when the capacitor discharges below a second level provides the other edge of the output square wave signal, the time constants of each circuit being selected to be different;
   (b) means for inverting the output square wave signal from the third circuit threshold means; and
   (c) AND gate means responsive to the inverted square wave signal from the means for inverting and the output square wave signal from the second circuit for producing a series of precisely timed delayed pulses, with each pulse having a predetermined pulse width.

* * * * *